(12) United States Patent
Suda

(10) Patent No.: US 12,232,247 B2
(45) Date of Patent: Feb. 18, 2025

(54) CIRCUIT MODULE AND COMMUNICATION DEVICE

(71) Applicant: Sumitomo Electric Industries, Ltd., Osaka (JP)

(72) Inventor: Noriyoshi Suda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 244 days.

(21) Appl. No.: 17/918,384

(22) PCT Filed: Apr. 30, 2021

(86) PCT No.: PCT/JP2021/017196
§ 371 (c)(1),
(2) Date: Oct. 12, 2022

(87) PCT Pub. No.: WO2021/225116
PCT Pub. Date: Nov. 11, 2021

(65) Prior Publication Data
US 2023/0199940 A1    Jun. 22, 2023

(30) Foreign Application Priority Data

May 7, 2020  (JP) ................................ 2020-082040

(51) Int. Cl.
*H05K 1/02*  (2006.01)
*H05K 1/11*  (2006.01)
*H05K 1/18*  (2006.01)

(52) U.S. Cl.
CPC .......... *H05K 1/0219* (2013.01); *H05K 1/115* (2013.01); *H05K 1/185* (2013.01); *H05K 2201/09636* (2013.01)

(58) Field of Classification Search
CPC ...... H05K 1/02; H05K 1/0206; H05K 1/0219; H05K 1/11; H05K 1/111–115;
(Continued)

(56) References Cited

U.S. PATENT DOCUMENTS 7,768,792 B2 *  8/2010  Kim .................... H04B 1/52
361/792
7,885,081 B2 *  2/2011  Kawagishi ............ H01L 24/82
361/764

(Continued)

FOREIGN PATENT DOCUMENTS

JP    2008-130915 A    6/2008
JP    2014-112645 A    6/2014
(Continued)

*Primary Examiner* — Tuan T Dinh
(74) *Attorney, Agent, or Firm* — Volpe Koenig

(57) ABSTRACT

A circuit module includes: a multilayer board having a plurality of first through-holes each penetrating at least one layer thereof; a plurality of high frequency components disposed in the plurality of first through-holes, respectively; and a plurality of shield parts individually surrounding the plurality of high frequency components. The multilayer board has a second through-hole penetrating at least a layer in which each high frequency component is disposed. Each of the plurality of shield parts includes a first conductor, a second conductor, and a third conductor. The first conductor and the second conductor sandwich the high frequency component in a lamination direction of the multilayer board. The third conductor is disposed in the second through-hole.

8 Claims, 5 Drawing Sheets

(58) Field of Classification Search
CPC .............. H05K 1/18; H05K 1/181–187; H01L 23/3121; H01L 23/3677; H01L 23/49822; H01L 23/49827; H01L 23/552; H01L 23/5389; H01L 23/66
USPC ........ 361/764–766, 784, 790, 792–795, 816, 361/818; 257/660–690
See application file for complete search history.

(56) References Cited

U.S. PATENT DOCUMENTS

| | | | | |
|---|---|---|---|---|
| 7,947,908 | B2 * | 5/2011 | Mizuno | H01L 23/552 |
| | | | | 361/776 |
| 8,168,893 | B2 * | 5/2012 | Ito | H01L 24/19 |
| | | | | 361/818 |
| 2002/0074654 | A1 * | 6/2002 | Koriyama | H05K 1/0243 |
| | | | | 257/728 |
| 2004/0155723 | A1 * | 8/2004 | Koriyama | H01P 5/107 |
| | | | | 333/26 |
| 2006/0110859 | A1 * | 5/2006 | Shigemura | H01L 27/0617 |
| | | | | 257/E21.705 |
| 2007/0200204 | A1 * | 8/2007 | Suzuki | H01P 1/162 |
| | | | | 257/664 |
| 2008/0007927 | A1 * | 1/2008 | Ito | H01L 24/82 |
| | | | | 361/764 |
| 2014/0133117 | A1 | 5/2014 | Saji et al. | |
| 2015/0016067 | A1 * | 1/2015 | Song | H05K 1/0218 |
| | | | | 29/830 |
| 2017/0154871 | A1 | 6/2017 | Inagaki | |
| 2019/0159332 | A1 | 5/2019 | Ishibashi et al. | |
| 2020/0126896 | A1 | 4/2020 | Yoshioka et al. | |

FOREIGN PATENT DOCUMENTS

| | | |
|---|---|---|
| JP | 2017-103282 A | 6/2017 |
| WO | 2017/145331 A1 | 8/2017 |
| WO | 2017/187559 A1 | 11/2017 |

* cited by examiner

CIRCUIT MODULE AND COMMUNICATION DEVICE

TECHNICAL FIELD

The present disclosure relates to a circuit module and a communication device. This application claims priority on Japanese Patent Application No. 2020-082040 filed on May 7, 2020, the entire content of which is incorporated herein by reference.

BACKGROUND ART

In a circuit having an IC chip mounted thereon, it is required to suppress electromagnetic interference from another electronic device and the like to the IC chip, and to suppress electromagnetic influence from the IC chip to another electronic device and the like. Therefore, an electromagnetic shield is provided by covering the IC chip by a metal plate being an electric conductor.

PATENT LITERATURE 1 discloses a surface-mounted semiconductor package in which a plurality of IC chips are sealed by a mold member made of a synthetic resin. In the semiconductor package disclosed in PATENT LITERATURE 1, an electromagnetic shield is provided by covering a package body including a plurality of IC chips by a conductive thin film.

CITATION LIST

Patent Literature

PATENT LITERATURE 1: International Publication No. WO2017/145331

SUMMARY OF THE INVENTION

A circuit module according to one aspect of the present disclosure includes: a multilayer board having a plurality of first through-holes each penetrating at least one layer thereof, a plurality of high frequency components disposed in the plurality of first through-holes, respectively; and a plurality of shield parts individually surrounding the plurality of high frequency components. The multilayer board has a second through-hole penetrating at least a layer in which each high frequency component is disposed. Each of the plurality of shield parts includes a first conductor, a second conductor, and a third conductor. The first conductor and the second conductor sandwich the high frequency component in a lamination direction of the multilayer board. The third conductor is disposed in the second through-hole.

A communication device according to one aspect of the present disclosure includes: a transmission circuit configured to output a transmission signal of a high frequency; and a circuit module configured to amplify the transmission signal outputted by the transmission circuit. The circuit module includes: a multilayer board having a plurality of first through-holes each penetrating at least one layer thereof; a plurality of amplifiers disposed in the plurality of first through-holes, respectively; and a plurality of shield parts individually surrounding the plurality of amplifiers. The multilayer board has a second through-hole penetrating at least a layer in which each amplifier is disposed. Each of the plurality of shield parts includes a first conductor, a second conductor, and a third conductor. The first conductor and the second conductor sandwich the amplifier in a lamination direction of the multilayer board. The third conductor is disposed in the second through-hole.

The present disclosure can be realized not only as a circuit module having such a characteristic configuration as described above, but also as a communication device including the circuit module, or as a method for manufacturing the circuit module.

DETAILED DESCRIPTION

Figure 1:
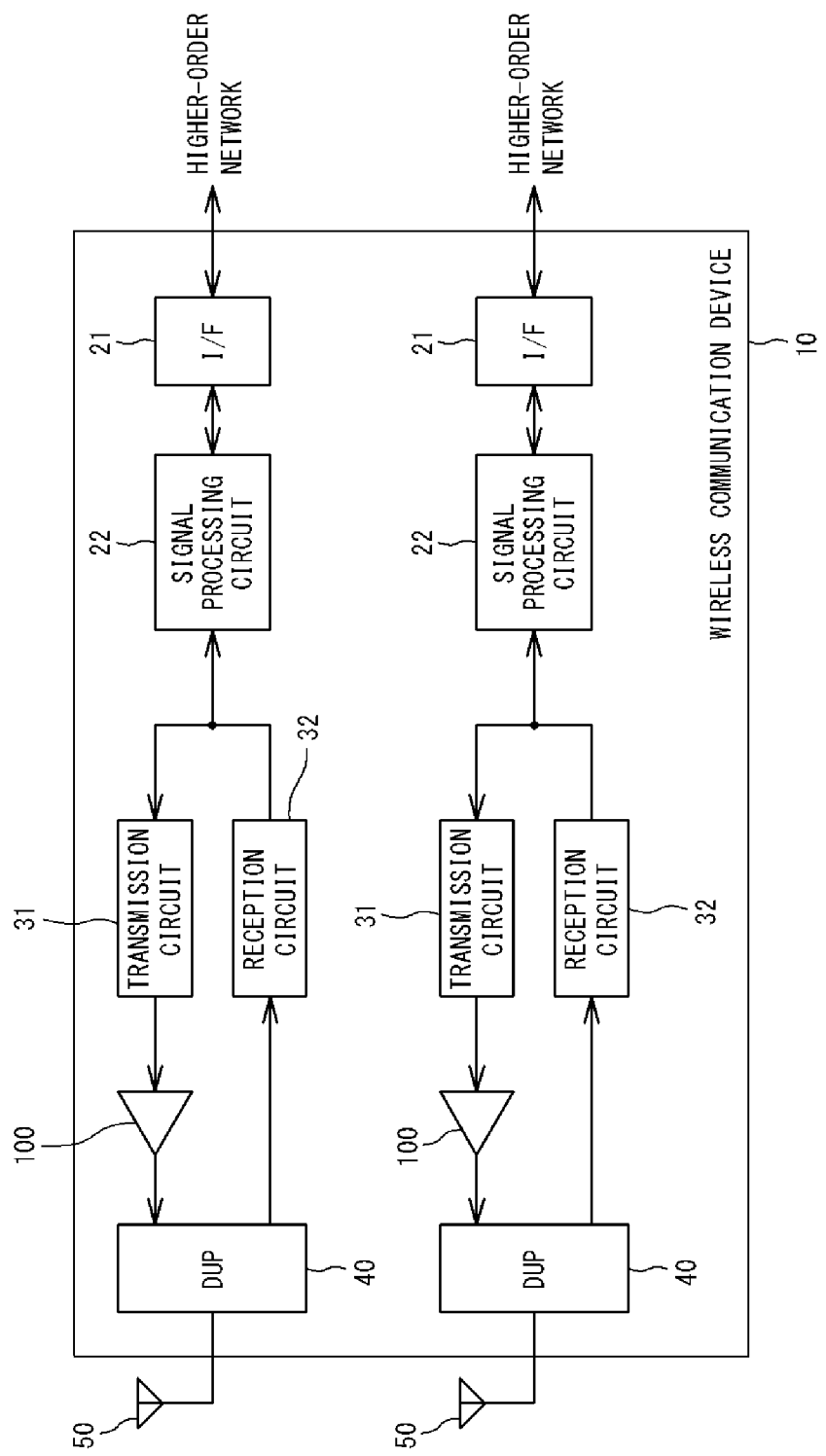
FIG. 1 is a block diagram showing a configuration of a wireless communication device according to a first embodiment.

Problems to be Solved by the Present Disclosure

The semiconductor package disclosed in PATENT LITERATURE 1 is of a surface-mounted type and is mounted on a printed wiring board. On the printed wiring board, many passive components and active components are installed other than the semiconductor package, and thus, the area of the circuit is increased. Therefore, downsizing of the circuit is desired.

Effects of the Present Disclosure

According to the present disclosure, while deterioration of isolation between components is suppressed, downsizing of a circuit module can be realized.

Outline of Embodiment of the Present Disclosure

Hereinafter, outlines of embodiments of the present disclosure are listed and described.

(1) A circuit module according to the present embodiment includes: a multilayer board having a plurality of first through-holes each penetrating at least one layer thereof, a plurality of high frequency components disposed in the plurality of first through-holes, respectively; and a plurality of shield parts individually surrounding the plurality of high frequency components. The multilayer board has a second through-hole penetrating at least a layer in which each high frequency component is disposed. Each of the plurality of shield parts includes a first conductor, a second conductor, and a third conductor. The first conductor and the second conductor sandwich the high frequency component in a lamination direction of the multilayer board. The third conductor is disposed in the second through-hole. Accordingly, an electromagnetic wave shield is provided for each of the plurality of high frequency components, and thus, deterioration of isolation between components can be suppressed. Further, since the circuit is configured in a three-dimensional manner by the multilayer board, the area (the area of the multilayer board) of the circuit module can be reduced.

(2) In the circuit module according to the present embodiment, a plurality of the second through-holes may be provided around each high frequency component, and a plurality of the third conductors may be disposed in the plurality of the second through-holes, respectively. Accordingly, the effect of the electromagnetic wave shield for the high frequency component can be improved.

(3) In the circuit module according to the present embodiment, the multilayer board may include a wiring being a conductor and connected to a terminal of the high frequency component in a disposition layer in which the high frequency component is disposed, and an interval between a pair of the second through-holes adjacent to each other with the wiring therebetween may be greater than an interval between another pair of the second through-holes adjacent to each other. Accordingly, while the region for wiring is ensured, a highly effective electromagnetic wave shield can be configured.

(4) In the circuit module according to the present embodiment, the plurality of high frequency components may include a first amplifier and a second amplifier having a higher amplification factor than that of the first amplifier, and an interval between a plurality of the second through-holes provided around the second amplifier may be smaller than an interval between a plurality of the second through-holes provided around the first amplifier. The intensities of electromagnetic waves radiated from amplifiers differ according to the amplification factors. With the above configuration, an electromagnetic wave shielding effect according to the amplification factor of each amplifier can be obtained.

(5) In the circuit module according to the present embodiment, the first through-hole may be provided in a disposition layer being a part of layers of the multilayer board, and the second through-hole may form a via provided in the disposition layer. Accordingly, the shield part can be provided to a part of layers of the multilayer board. Therefore, in a layer that is different from the layer to which the shield part is provided, a circuit can be provided so as to overlap the high frequency component.

(6) In the circuit module according to the present embodiment, the disposition layer may include a layer, at one end, of the multilayer board. Accordingly, the high frequency component is disposed at one end of the multilayer board. Therefore, cooling efficiency of the high frequency component can be enhanced.

(7) The circuit module according to the present embodiment may further include a base metal provided at an end surface, in the lamination direction, of the multilayer board. The disposition layer may include a layer, at an end in the lamination direction, of the multilayer board. The high frequency component may be attached to the base metal. The second conductor may be the base metal. Accordingly, cooling efficiency of the high frequency component can be enhanced by a high thermal conductivity of the base metal.

(8) In the circuit module according to the present embodiment, the multilayer board may include a wiring layer that is a layer different from the disposition layer and that includes a wiring being a conductor. The wiring layer may include a via connected to the disposition layer. The wiring included in the wiring layer may be connected to a terminal of the high frequency component through the via. Accordingly, even when a high output high frequency component that requires a thick copper wiring is used, restriction on wiring layout can be reduced by the wiring layer.

(9) A communication device according to the present embodiment includes: a transmission circuit configured to output a transmission signal of a high frequency; and a circuit module configured to amplify the transmission signal outputted by the transmission circuit. The circuit module includes: a multilayer board having a plurality of first through-holes each penetrating at least one layer thereof; a plurality of amplifiers disposed in the plurality of first through-holes, respectively; and a plurality of shield parts individually surrounding the plurality of amplifiers. The multilayer board has a second through-hole penetrating at least a layer in which each amplifier is disposed. Each of the plurality of shield parts includes a first conductor, a second conductor, and a third conductor. The first conductor and the second conductor sandwich the amplifier in a lamination direction of the multilayer board. The third conductor is disposed in the second through-hole. Accordingly, an electromagnetic wave shield is provided for each of the plurality of amplifiers. Thus, deterioration of isolation between amplifiers can be suppressed. Further, since the circuit is configured in a three-dimensional manner by the multilayer board, the area (the area of the multilayer board) of the circuit module can be reduced.

Details of Embodiments of the Present Disclosure

Hereinafter, details of the embodiments of the present invention will be described with reference to the drawings. At least some parts of the embodiments described below may be combined together as desired.

1. First Embodiment

[1-1. Wireless Communication Device]

FIG. 1 is a block diagram showing a configuration of a wireless communication device according to the present embodiment. A wireless communication device 10 is a base station device for mobile communication, for example. The wireless communication device 10 includes an interface unit 21, a signal processing circuit 22, a transmission circuit 31, a reception circuit 32, an amplification circuit 100, a duplexer 40, and an antenna 50. In the example shown in FIG. 1, the wireless communication device 10 has a plurality of communication systems each including the interface unit 21, the signal processing circuit 22, the transmission circuit 31, the reception circuit 32, the amplification circuit 100, the duplexer 40, and the antenna 50, but the configuration of the wireless communication device 10 is not limited thereto. The wireless communication device 10 may be provided with a single communication system described above.

The transmission circuit 31 performs quadrature modulation on transmission data provided as a digital baseband signal from the signal processing circuit 22. The transmission circuit 31 has connected thereto the amplification circuit 100. The transmission circuit 31 converts the transmission data into an analog radio signal, and outputs the radio signal to the amplification circuit 100.

The amplification circuit 100 amplifies the radio signal (transmission signal). The amplified transmission signal is outputted to the duplexer 40. The duplexer 40 separates a transmission signal and a reception signal, and outputs the transmission signal to the antenna 50. The transmission signal outputted from the duplexer 40 is transmitted from the antenna 50.

A radio signal (reception signal) received by the antenna 50 from a mobile terminal is inputted to the duplexer 40. The duplexer 40 separates a transmission signal and a reception signal, and outputs the reception signal to the reception circuit 32.

The reception circuit 32 amplifies the received reception signal and performs AD (analog-digital) conversion on the amplified reception signal. The reception circuit 32 performs quadrature demodulation on the digital reception signal (reception data), and outputs, as a baseband signal, the reception data having been subjected to quadrature demodulation.

The signal processing circuit 22 is connected to a higher-order network via the interface unit 21, and transmits/receives an IP packet to/from the higher-order network. Further, the signal processing circuit 22 executes a conversion process between an IP packet and a baseband signal.

[1-2. Amplification Circuit]

Next, the amplification circuit 100 will be described. The amplification circuit 100 is an example of a circuit module.

Figure 2:
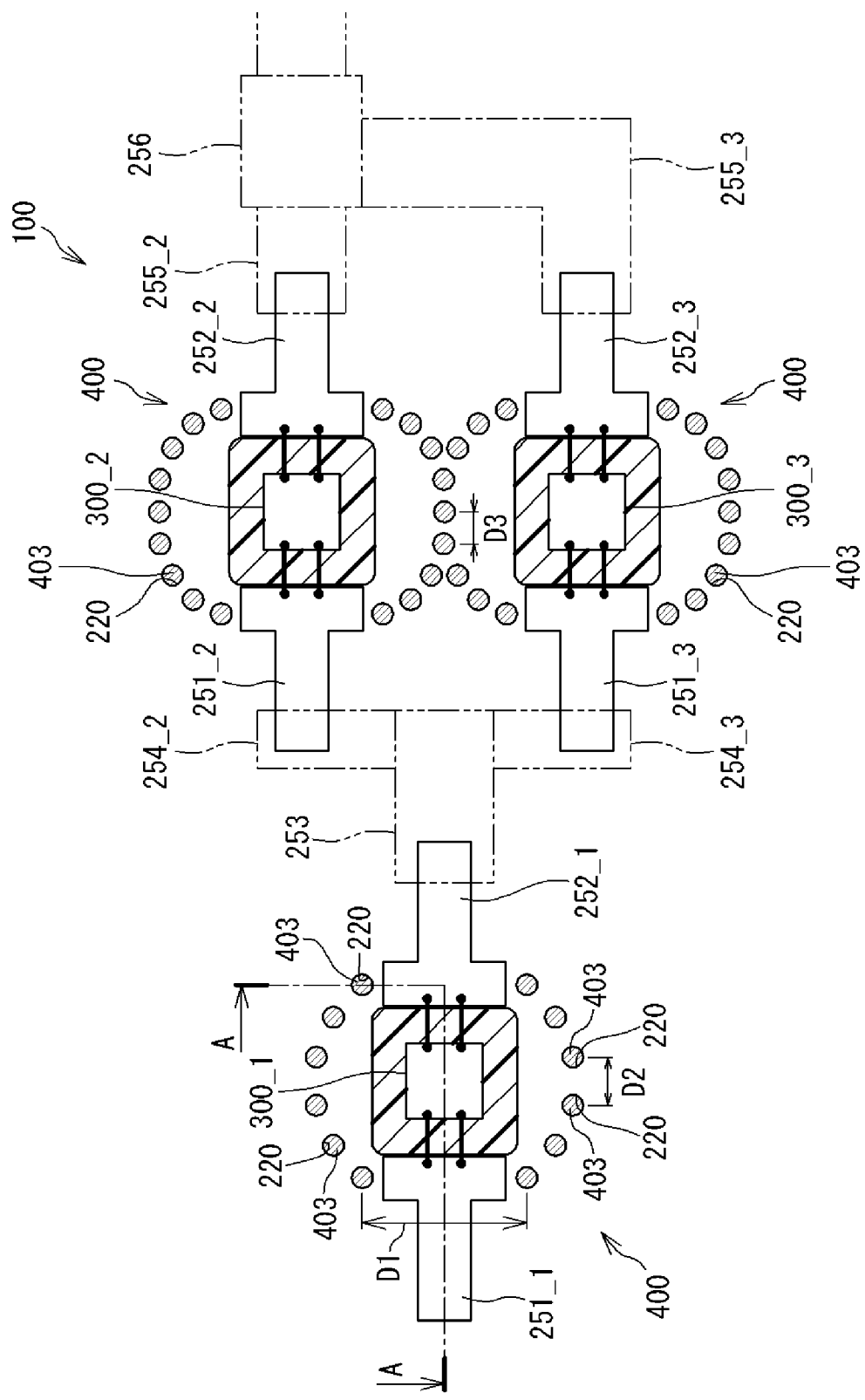
FIG. 2 is a plan cross-sectional view showing an example of a configuration of an amplification circuit according to the first embodiment.
Figure 3:
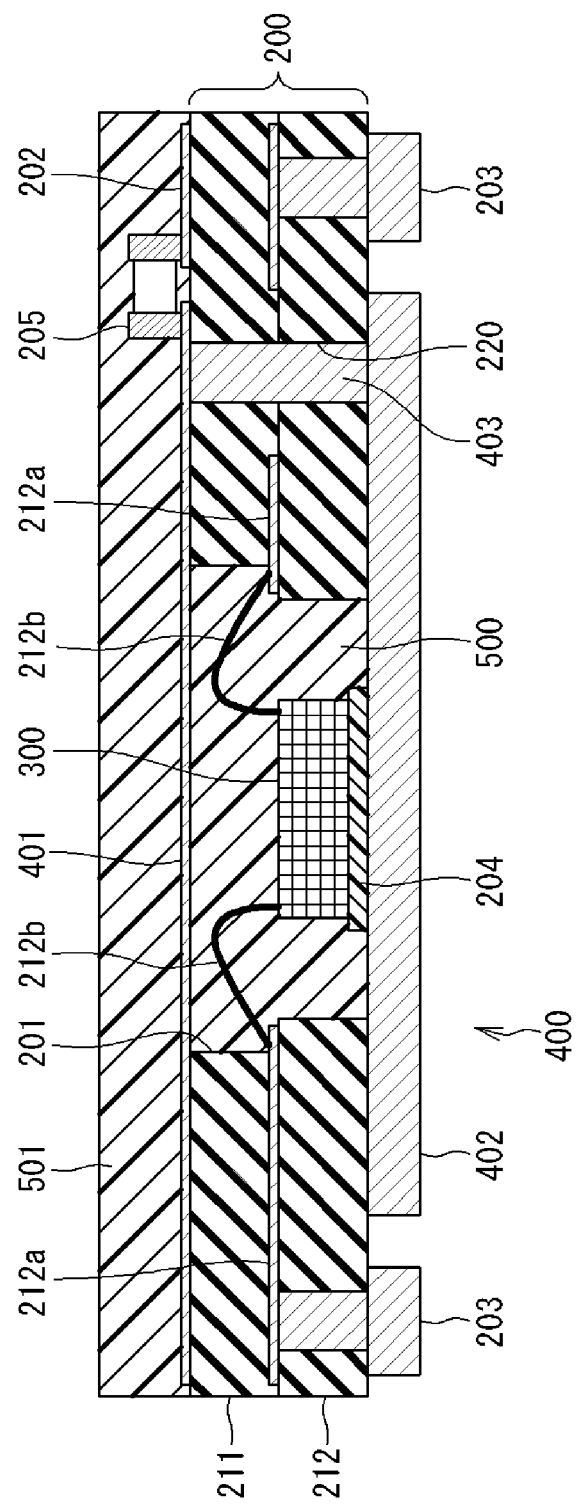
FIG. 3 is an enlarged side cross-sectional view along a line A-A shown in FIG. 2.

FIG. 2 is a plan cross-sectional view showing an example of a configuration of an amplification circuit according to the present embodiment, and FIG. 3 is an enlarged side cross-sectional view along a line A-A shown in FIG. 2. The amplification circuit 100 shown in FIG. 2 and FIG. 3 includes a multilayer printed circuit board 200, a plurality of power amplifiers 300_1, 300_2, 3003, and a plurality of shield parts 400. Hereinafter, the plurality of power amplifiers 300_1, 300_2, 300_3 will also be collectively referred to as "power amplifier 300". The amplification circuit 100 is a circuit module packaged such that the plurality of power amplifiers 300 and the plurality of shield parts 400 are embedded in the multilayer printed circuit board 200 and each power amplifier 300 is sealed by a mold member 500.

FIG. 2 shows a layer in which the power amplifiers 3001, 300_2, 300_3 are disposed. The alternate long and two short dashes lines in FIG. 2 represent wirings and electronic components provided in other layers. As shown in FIG. 2, the plurality of power amplifiers 300 are connected to each other by wirings being conductors. More specifically, the input terminal (gate terminal) of one power amplifier 300_1 is connected to a signal line 251_1 being a conductor connected to the transmission circuit 31. The output terminal (drain terminal) of the power amplifier 3001 is connected to a signal line 252_1. The signal line 2521 is connected through a via (not shown) to a divider 253 provided at an upper layer, and the divider 253 is connected to signal lines 254_2, 254_3.

The signal line 2542 is connected to a signal line 251_2 at a lower layer through a via, and the signal line 251_2 is connected to the input terminal of the power amplifier 300_2. The output terminal of the power amplifier 300_2 is connected to a signal line 252_2. The signal line 252_2 is connected to a signal line 2552 at an upper layer through a via, and the signal line 255_2 is connected to the input terminal of a combiner 256.

The signal line 2543 is connected to a signal line 251_3 at a lower layer through a via, and the signal line 251_3 is connected to the input terminal of the power amplifier 300_3. The output terminal of the power amplifier 300_3 is connected to a signal line 252_3. The signal line 252_3 is connected to a signal line 2553 at an upper layer through a via, and the signal line 255_3 is connected to the input terminal of the combiner 256.

As described above, the output terminal of one power amplifier 300_1 is connected to the input terminals of two power amplifiers 300_2, 300_3. The power amplifier 300_1 amplifies a transmission signal outputted from the transmission circuit 31. The power amplifiers 300_2, 300_3 form a Doherty amplifier. The power amplifier 3002 is a main amplifier and the power amplifier 300_3 is a peak amplifier. The divider 253 distributes a signal outputted from the power amplifier 3001, to the power amplifiers 300_2 and 300_3. The power amplifiers 300_2, 300_3 further amplify the transmission signal amplified by the power amplifier 300_1. The combiner 256 synthesizes signals outputted from the respective power amplifiers 300_2 and 300_3, and outputs the synthesized signal to the duplexer 40.

[1-3. Shield Structure for Power Amplifier]

FIG. 3 shows an example of a portion including one power amplifier 300 of the amplification circuit 100. In the example shown in FIG. 3, the number of layers of the multilayer printed circuit board 200 is 2. In the multilayer printed circuit board 200, layers are laminated in the up-down direction. That is, the lamination direction is the vertical direction. The multilayer printed circuit board 200 has provided therein a space (first through-hole) 201. In this example, the space 201 is formed in the entirety, i.e., two layers, in the lamination direction of the multilayer printed circuit board 200. That is, the space 201 is a through-hole penetrating the two layers of the multilayer printed circuit board 200.

A base metal 402 is provided at the lower surface of the multilayer printed circuit board 200. The base metal 402 is a metal plate which is a conductor having a high thermal conductivity. The base metal 402 is disposed so as to close the lower opening of the space 201. Further, metal-made terminals 203 being conductors are provided at the lower surface of the multilayer printed circuit board 200.

The power amplifier 300 is disposed in the space 201. The power amplifier 300 is adhered to the upper surface of the base metal 402 by an adhesive 204. The multilayer printed circuit board 200 has a two-layer structure composed of an upper layer 211 and a lower layer 212. A printed circuit 212a implemented by a copper foil is provided between the upper layer 211 and the lower layer 212. The printed circuit 212a is the signal lines 251_1, 251_2, 2513, 252_1, 252_2, 252_3 described above. In the space 201, the lower layer 212 protrudes relative to the upper layer 211, and step portions are formed at the inner wall of the space 201. In the space 201, the printed circuit 212a is exposed at the protruding portions of the lower layer 212, and the exposed portions of the printed circuit 212a and the terminals, i.e., the input terminal (gate terminal) and the output terminal (drain terminal), of the power amplifier 300 are connected by bonding wires 212b.

As described above, the space 201 in which the power amplifier 300 and the bonding wires 212b are disposed is filled with the mold member 500 being a synthetic resin. Accordingly, the power amplifier 300 and the bonding wires 212b are sealed.

The multilayer printed circuit board 200 is provided with a plurality of through-holes (second through-holes) 220. In the example in FIG. 3, each through-hole 220 penetrates the entirety, in the thickness direction, of the multilayer printed circuit board 200. A conductor 403 having a pillar shape or a cylindrical shape is disposed in the through-hole 220. In a specific example, the conductor 403 is copper plating, and the through-hole 220 and the conductor 403 form a via. The plurality of through-holes 220 are provided (see FIG. 2) so as to surround the space 201 in which the power amplifier 300 is disposed, and a conductor 403 is disposed in each of the through-holes 220.

As shown in FIG. 3, a thin conductor 401 is disposed at the upper surface of the upper layer 211 so as to cover the entirety of the space 201. The conductor 401 may be formed by a copper foil for printed circuit, for example. In a plan view, the conductor 401 is provided in a range that covers the entirety of the plurality of through-holes 220 provided around the space 201. Similarly, the base metal 402 is provided in a range that covers the entirety of the plurality of through-holes 220.

A printed circuit 202 and a surface-mounted component 205 are disposed, together with the conductor 401, at the upper surface of the multilayer printed circuit board 200. The surface-mounted component 205 includes the divider 253 and the combiner 256. The conductor 401, the printed circuit 202, and the surface-mounted component 205 are covered by a mold member 501 being a synthetic resin.

Each shield part 400 is composed of the conductor 401, the base metal 402, and the plurality of conductors 403. The shield part 400 surrounds, in a three-dimensional manner, the power amplifier 300 being a high frequency component. Therefore, isolation between the power amplifiers 300 in the module can be improved.

FIG. 2 is referred to again. The conductors 403 around the power amplifier 300 are disposed with an interval therebetween. Further, an interval D1 between a pair of through-holes 220 adjacent to each other with the bonding wire 212b therebetween is greater than an interval D2 between another pair of through-holes 220 adjacent to each other. Accordingly, while the region for wiring is ensured, the effect of the electromagnetic wave shield can be improved.

As shown in FIG. 2, the interval D2 between conductors 403 (through-holes 220) around the power amplifier 300_1, and an interval D3 between conductors 403 (through-holes 220) around the power amplifier 300_2, 300_3 are different from each other. More specifically, the interval D3 between conductors 403 around the power amplifier 3002, 300_3 on the signal output side is smaller than the interval D2 between conductors 403 around the power amplifier 300_1 on the signal input side. The smaller the interval between conductors 403 is, the more densely the conductors 403 are disposed, and thus, the effect of the electromagnetic wave shield is higher. That is, the shield effect at the power amplifier 300_2, 300_3 on the signal output side can be made higher than the shield effect at the power amplifier 300_1 on the signal input side. For example, when the amplification factor of the power amplifier 300_2, 300_3 is higher than the amplification factor of the power amplifier 300_1, a high electromagnetic wave shielding effect can be obtained for the power amplifier 300_2, 300_3 having the higher amplification factor.

[1-4. Cooling Structure for Power Amplifier]

Figure 4:
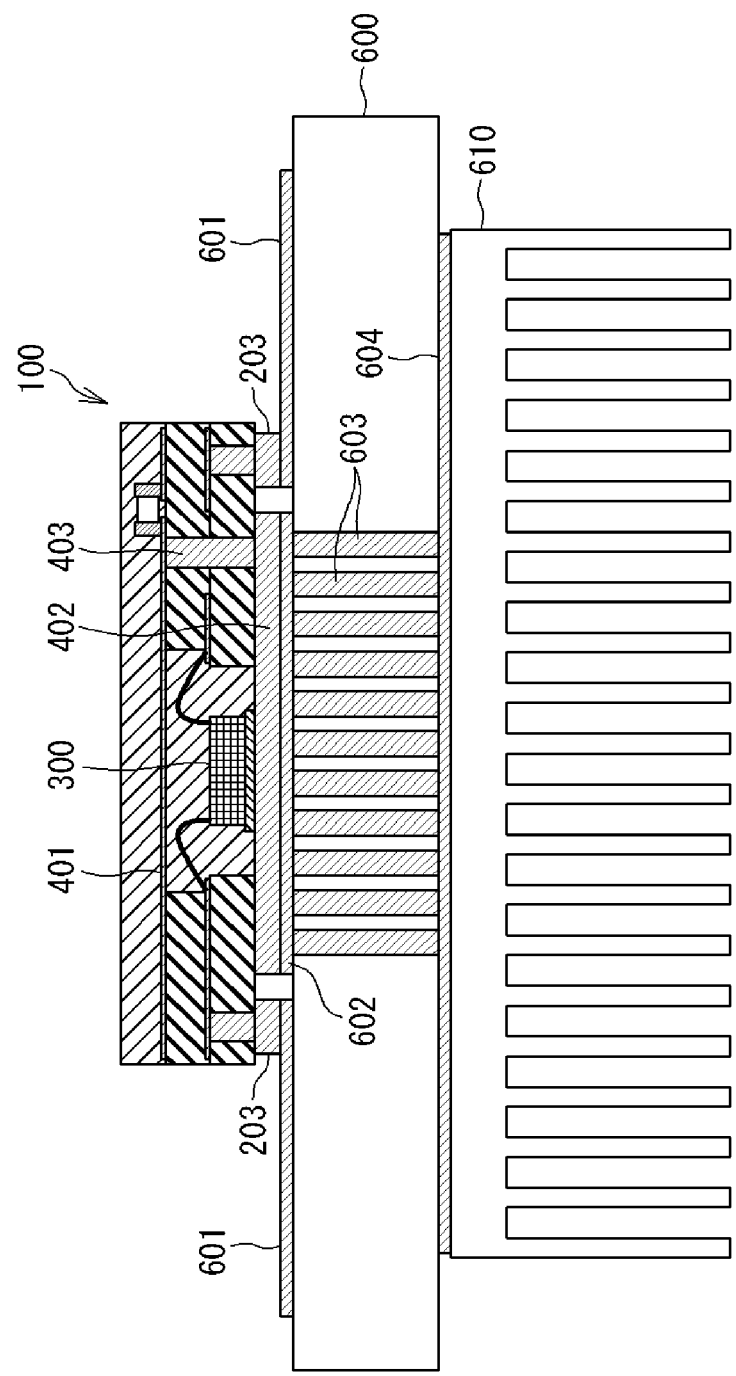
FIG. 4 is a side cross-sectional view showing an example of a cooling structure for a power amplifier according to the first embodiment.

FIG. 4 is a side cross-sectional view showing an example of a cooling structure for a power amplifier according to the present embodiment. The amplification circuit 100 configured as a module as described above is attached to the surface of a printed circuit board 600. The terminals 203 provided at the lower surface of the amplification circuit 100 are connected to wirings 601 provided at the upper surface of the printed circuit board 600.

A thermal conduction part 602 being a copper foil is provided, together with the wirings 601, at the upper surface of the printed circuit board 600. The thermal conduction part 602 is connected to the base metal 402. The thermal conduction part 602 has the same planar shape and size as those of the base metal 402, and the entirety of the lower surface of the base metal 402 and the entirety of the upper surface of the thermal conduction part 602 are adhered to each other by solder.

A plurality of through-holes are provided inside the printed circuit board 600, and a metallic pillar-shaped member 603 having a high thermal conductivity is disposed in each through-hole. These through-holes are provided below the thermal conduction part 602, and the upper end of each pillar-shaped member 603 is connected to the lower surface of the thermal conduction part 602.

A thermal conduction part 604 being a copper foil is provided at the lower surface of the printed circuit board 600. The thermal conduction part 604 has a larger area than the thermal conduction part 602, and is disposed so as to overlap the thermal conduction part 602 in a plan view. The lower end of each pillar-shaped member 603 is connected to the upper surface of the thermal conduction part 604. A heat sink 610 is attached to the lower surface of the thermal conduction part 604. The heat sink 610 is implemented by a metal (e.g., aluminum, copper) having a high thermal conductivity, and is provided with a plurality of fins for cooling.

As described above, heat generated by the power amplifier 300 is transmitted to the base metal 402, the thermal conduction part 602, the pillar-shaped members 603, the thermal conduction part 604, and the heat sink 610. The heat transmitted to the heat sink 610 is radiated from the fins to the outside. In this manner, the power amplifier 300 is cooled.

2. Second Embodiment

Figure 5:
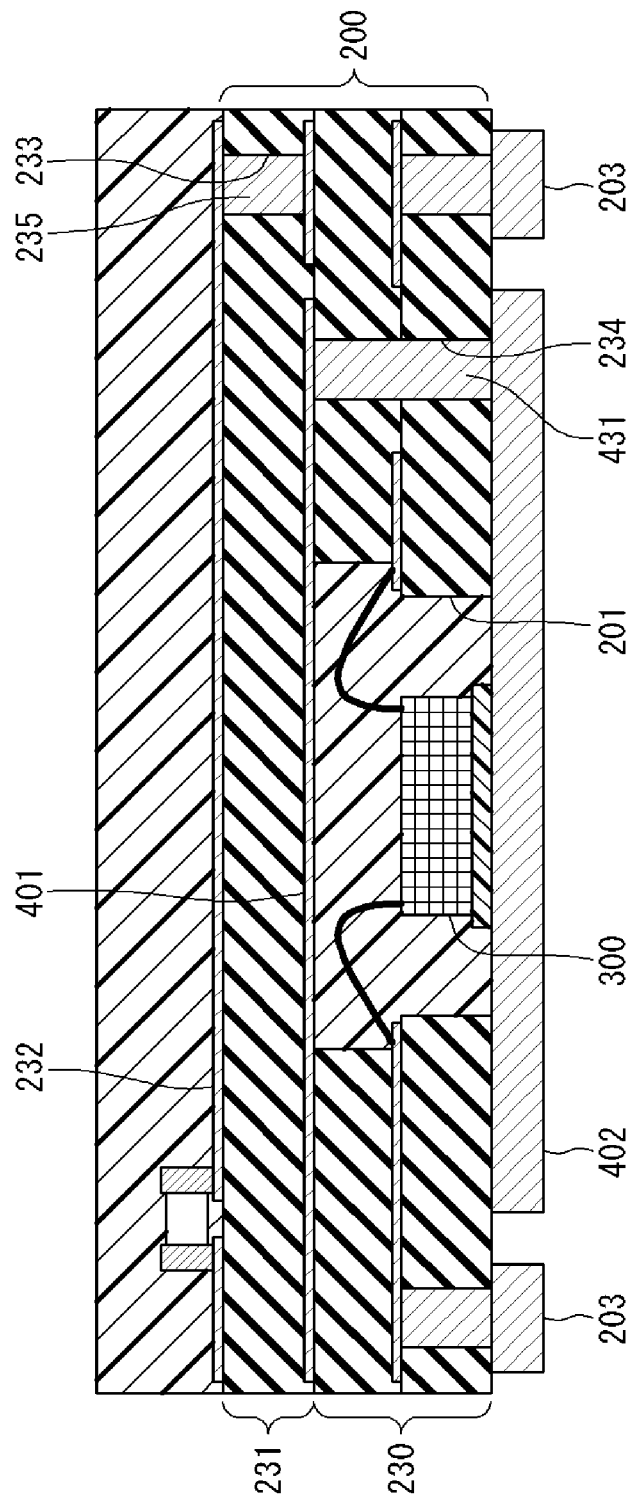
FIG. 5 is a partial side cross-sectional view showing an example of a configuration of an amplification circuit according to a second embodiment.

FIG. 5 is a partial side cross-sectional view showing an example of a configuration of an amplification circuit according to the present embodiment. As shown in FIG. 5, in the multilayer printed circuit board 200 according to the present embodiment, the space 201 is provided in a part of the layers. That is, the space 201 is a through-hole that penetrates a part of layers of the multilayer printed circuit board 200. Hereinafter, the layers in which the space 201 is provided will be referred to as a disposition layer 230. The multilayer printed circuit board 200 has a dielectric layer different from the disposition layer 230. This dielectric layer will be referred to as a wiring layer 231. The wiring layer 231 is the uppermost layer of the multilayer printed circuit board 200, and at the surface (upper surface) thereof, a printed circuit 232 implemented by a conductor foil is provided. The disposition layer 230 includes the lowermost layer of the multilayer printed circuit board 200. The power amplifier 300 is attached to the base metal 402 provided at the lower surface of the multilayer printed circuit board 200. Accordingly, the distance between the power amplifier 300 and the printed circuit board to which the amplification circuit 100 is mounted is shortened, and the power amplifier 300 can be efficiently cooled. It is noted that the disposition layer 230 may include the uppermost layer of the multilayer printed circuit board 200. In this case, for example, when the upper surface of the conductor 401 is exposed and a heat sink is directly attached to this surface, the power amplifier 300 can be efficiently cooled.

For example, the printed circuit 232 may include a wiring for applying an input voltage (gate voltage) to the power amplifier 300, and may include a wiring for applying an output voltage (drain voltage) to the power amplifier 300. The printed circuit 232 is connected to the terminals (gate terminal, drain terminal) of the power amplifier 300 through vias 233 provided to the wiring layer 231. Accordingly, a circuit can be configured in a three-dimensional manner, and the degree of freedom of wiring is improved. That is, for example, it is possible to suppress detouring, to a great extent, the wiring for a gate voltage and the wiring for a drain voltage in order to avoid interference with other wirings, whereby increase in size of the circuit is suppressed.

The shield part 400 according to the present embodiment includes a pillar-shaped member 431 inserted in a through-hole 234 being a through-hole that penetrates the disposition layer 230. The through-hole 234 penetrates only the disposition layer 230. That is, the through-hole 234 does not penetrate the wiring layer 231. Since the pillar-shaped member 431 being a conductor is provided only to the disposition layer 230, wiring of the wiring layer 231 is not hindered by the pillar-shaped member 431. Further, the pillar-shaped member 431 is disposed according to the height of the power amplifier 300, and the power amplifier 300 can be surrounded by the shield part 400 including the pillar-shaped member 431. Therefore, isolation between the power amplifiers 300 can be ensured.

3. Modification

The configuration of the amplification circuit is not limited to the above embodiments. For example, the high frequency component is not limited to the power amplifier 300. As long as the high frequency component is a component that is used in processing of a high frequency signal, the high frequency component may be an IC (Integrated Circuit) chip or a semiconductor chip, or an active component or a passive component.

Further, the through-hole is not limited to a circular hole. As long as the hole penetrates at least one layer of the multilayer printed circuit board 200, the planar shape of the hole may be any shape. For example, the through-hole may be a slender slit that is parallel to one side of the power amplifier 300 having a rectangular shape in a plan view. The conductor disposed in the through-hole may have any shape that matches the shape of the through-hole. For example, a conductor having a slender plate shape may be disposed in a slit-shaped through-hole.

Further, the power amplifier 300 need not necessarily be disposed in the lowermost layer of the multilayer printed circuit board 200. For example, the space 201 may be provided in an inner layer of the multilayer printed circuit board 200 having three or more layers, and the power amplifier 300 (high frequency component) may be disposed in the space 201. As a still another configuration, the space 201 may be provided in a layer that includes the upper layer of the multilayer printed circuit board 200, and the power amplifier 300 (high frequency component) may be disposed in the space 201.

Further, the divider 253 may be disposed at the same layer as that of the signal line 252_1, 251_2, 251_3, and the combiner 256 may be disposed at the same layer as that of the signal line 255_2, 255_3. Accordingly, without providing vias, the divider 253 and the signal line 252_1, 251_2, 251_3 can be connected to each other, and the combiner 256 and the signal line 255_2, 255_3 can be connected to each other.

4. Effects

As described above, the amplification circuit 100 includes the multilayer printed circuit board 200, the power amplifiers 300, and the shield parts 400. The multilayer printed circuit board 200 has a plurality of spaces 201 in at least one layer thereof. The plurality of power amplifiers 300 are disposed in the plurality of spaces 201, respectively. The plurality of shield parts 400 individually surround the plurality of power amplifiers 300. The multilayer printed circuit board 200 has the through-hole 220 penetrating at least the layer in which the power amplifier 300 is disposed. Each of the plurality of shield parts 400 includes the conductor 401, the base metal 402, and the conductor 403. The conductor 401 and the base metal 402 sandwich the power amplifier 300 in the lamination direction of the multilayer printed circuit board 200. The conductor 403 is disposed in the through-hole 220. Accordingly, an electromagnetic wave shield is provided for each of the plurality of power amplifiers 300. Thus, deterioration of isolation between the power amplifiers 300 can be suppressed. Further, since the circuit is configured in a three-dimensional manner by the multilayer printed circuit board 200, the area (the planar area of the multilayer printed circuit board 200) of the amplification circuit 100 can be reduced.

A plurality of the through-holes 220 may be provided around each power amplifier 300. A plurality of the conductors 403 may be disposed in the plurality of the through-holes 220, respectively. Accordingly, the effect of the electromagnetic wave shield for the power amplifier 300 can be improved.

The multilayer printed circuit board 200 may include wirings being conductors and connected to the terminals of the power amplifier 300, in the disposition layer 230 in which the power amplifier 300 is disposed. The interval between a pair of through-holes 220 adjacent to each other with the wiring therebetween may be greater than the interval between another pair of through-holes 220 adjacent to each other. Accordingly, while the region for wiring is ensured, a highly effective electromagnetic wave shield can be configured.

The plurality of power amplifiers 300 may include the power amplifier 300_1, and the power amplifier 300_2, 300_3 having a higher amplification factor than that of the power amplifier 300_1. The interval between a plurality of through-holes 220 provided around the power amplifier 300_2, 300_3 may be smaller than the interval between a plurality of through-holes 220 provided around the power amplifier 300_1. The intensities of electromagnetic waves radiated from the power amplifiers 300 differ according to the amplification factors. With the above configuration, an electromagnetic wave shielding effect according to the amplification factor of each power amplifier 300 can be obtained.

The space 201 may be provided in the disposition layer 230 being a part of layers of the multilayer printed circuit board 200. The through-hole 234 may be provided in the disposition layer 230. Accordingly, the shield part 400 can be provided to a part of layers of the multilayer printed circuit board 200. Therefore, in a layer that is different from the layer to which the shield part 400 is provided, a circuit can be provided so as to overlap the power amplifier 300.

The disposition layer 230 may include a layer, at the upper end or the lower end, of the multilayer printed circuit board 200. Accordingly, the power amplifier 300 is disposed at the upper end or the lower end of the multilayer printed circuit board. Therefore, cooling efficiency of the power amplifier 300 can be enhanced.

The amplification circuit 100 may include the base metal 402 provided at the lower end surface of the multilayer printed circuit board 200. The disposition layer 230 may include a layer, at the lower end, of the multilayer printed circuit board 200. The power amplifier 300 may be attached to the base metal 402. A conductor included in the shield part 400 may be the base metal 402. Accordingly, cooling efficiency of the power amplifier 300 can be enhanced by a high thermal conductivity of the base metal 402.

The multilayer printed circuit board 200 may include the wiring layer 231 that is a layer different from the disposition layer 230 and that includes a wiring being a conductor. The wiring layer 231 may include a through-hole connected to the disposition layer 230. The wiring included in the wiring layer 231 may be connected to a terminal of the power amplifier 300 through the through-hole. Accordingly, even when a high output power amplifier 300 that requires a thick copper wiring is used, restriction on wiring layout can be reduced by the wiring layer 231.

The wireless communication device 10 includes the transmission circuit 31 and the amplification circuit 100. The transmission circuit 31 outputs a transmission signal of a high frequency. The amplification circuit 100 amplifies the transmission signal outputted by the transmission circuit 31. The amplification circuit 100 includes the multilayer printed circuit board 200, the power amplifiers 300, and the shield parts 400. The multilayer printed circuit board 200 has a plurality of spaces 201 in at least one layer thereof. The plurality of power amplifiers 300 are disposed in the plurality of spaces 201, respectively. The plurality of shield parts 400 individually surround the plurality of power amplifiers 300. The multilayer printed circuit board 200 has the through-hole 220 penetrating at least a layer in which each power amplifier 300 is disposed. Each of the plurality of shield parts 400 includes the conductor 401, the base metal 402, and the conductor 403. The conductor 401 and the base metal 402 sandwich the power amplifier 300 in the lamination direction of the multilayer printed circuit board 200. The conductor 403 is disposed in the through-hole 220. Accordingly, an electromagnetic wave shield is provided for each of the plurality of power amplifiers 300. Thus, deterioration of isolation between the power amplifiers 300 can be suppressed. Further, since the circuit is configured in a three-dimensional manner by the multilayer printed circuit board 200, the area (the planar area of the multilayer printed circuit board 200) of the amplification circuit 100 can be reduced.

5. Supplementary Note

The embodiments disclosed herein are merely illustrative in all aspects and are not restrictive. The scope of the present disclosure is defined by the scope of the claims rather than the embodiments described above, and is intended to include meaning equivalent to the scope of the claims and all modifications within the scope.

REFERENCE SIGNS LIST 10 wireless communication device (communication device)
21 interface unit
22 signal processing circuit
31 transmission circuit
32 reception circuit
40 duplexer
50 antenna
100 amplification circuit (circuit module)
200 multilayer printed circuit board (multilayer board)
201 space (first through-hole)
202 printed circuit
203 terminal
204 adhesive
205 surface-mounted component
211 upper layer
212 lower layer
212a printed circuit
212b bonding wire
220, 234 through-hole (second through-hole)
230 disposition layer
231 wiring layer
232 printed circuit
233 via
251_1, 251_2, 2513, 2521, 252_2, 2523, 254_2, 2543, 255_2, 255_3 signal line
253 divider
256 combiner
300, 300_1, 300_2, 300_3 power amplifier (high frequency component)
400 shield part
401 conductor (first conductor)
402 base metal
403 conductor (third conductor)
431 pillar-shaped member (third conductor)
500, 501 mold member
600 printed circuit board
601 wiring
602 thermal conduction part
603 pillar-shaped member
604 thermal conduction part
610 heat sink

The invention claimed is:

1. A circuit module comprising:
a multilayer board having a plurality of first through-holes each penetrating at least one layer thereof;
a plurality of high frequency components disposed in the plurality of first through-holes, respectively; and
a plurality of shield parts individually surrounding the plurality of high frequency components, wherein
the multilayer board including a plurality of second through-holes, each penetrating at least a layer in which each high frequency component is disposed and each provided around each high frequency component, and
the multilayer board having a wiring being a conductor and connected to a terminal of the high frequency component in a disposition layer in which the high frequency component is disposed,
an interval between a pair of the plurality of second through-holes adjacent to each other with the wiring therebetween is greater than an interval between another pair of the plurality of second through-holes adjacent to each other,
each of the plurality of shield parts includes a first conductor, a second conductor, and a plurality of third conductors,
the first conductor and the second conductor sandwich the high frequency component in a lamination direction of the multilayer board, and
the plurality of third conductors are i-s-disposed in the plurality of second through-holes, respectively.

2. The circuit module according to claim 1, wherein the plurality of high frequency components include a first amplifier and a second amplifier having a higher amplification factor than that of the first amplifier, and
an interval between a first group of the plurality of the second through-holes provided around the second amplifier is smaller than an interval between a second group of the plurality of the second through-holes provided around the first amplifier.

3. The circuit module according to claim 1, wherein
the plurality of first through-holes are provided in the disposition layer,
the disposition layer being a part of layers of the multilayer board, and
each of the plurality of second through-holes form a via provided in the disposition layer.

4. The circuit module according to claim 3, wherein
the disposition layer includes a layer, at one end, of the multilayer board.

5. The circuit module according to claim 3, further comprising
a base metal provided at an end surface, in the lamination direction, of the multilayer board, wherein
the disposition layer includes a layer, at an end in the lamination direction, of the multilayer board,
the high frequency component is attached to the base metal, and
the second conductor is the base metal.

6. The circuit module according to claim 3, wherein
the multilayer board includes a wiring layer that is a layer different from the disposition layer and that includes a wiring being a conductor,
the wiring layer includes a via connected to the disposition layer, and
the wiring included in the wiring layer is connected to a terminal of the high frequency component through the via.

7. A communication device comprising:
a transmission circuit configured to output a transmission signal of a high frequency; and
a circuit module configured to amplify the transmission signal outputted by the transmission circuit, wherein
the circuit module includes
a multilayer board having a plurality of first through-holes each penetrating at least one layer thereof,
a plurality of amplifiers disposed in the plurality of first through-holes, respectively, and
a plurality of shield parts individually surrounding the plurality of amplifiers,
the multilayer board including a plurality of second through-holes each penetrating at least a layer in which each amplifier is disposed and each provided around each amplifier, and the multilayer board having a wiring being a conductor and connected to a terminal of the amplifier in a disposition layer in which the amplifier is disposed,
an interval between a pair of the plurality of second through-holes adjacent to each other with the wiring therebetween is greater than an interval between another pair of the plurality of second through-holes adjacent to each other,
each of the plurality of shield parts includes a first conductor, a second conductor, and a plurality of third conductors,
the first conductor and the second conductor sandwich the amplifier in a lamination direction of the multilayer board, and
the plurality of third conductors are disposed in the plurality of second through-holes, respectively.

8. A circuit module comprising:
a multilayer board having a plurality of first through-holes each penetrating at least one layer thereof;
a plurality of high frequency components disposed in the plurality of first through-holes, respectively, and include a first amplifier and a second amplifier having a higher amplification factor than that of the first amplifier; and
a plurality of shield parts individually surrounding the plurality of high frequency components, wherein
the multilayer board has a plurality of second through-holes each penetrating at least a layer in which each high frequency component is disposed and each provided around each high frequency component,
each of the plurality of shield parts includes a first conductor, a second conductor, and a plurality of third conductors,
the first conductor and the second conductor sandwich the high frequency component in a lamination direction of the multilayer board,
the plurality of third conductors are disposed in the plurality of second through-holes, respectively, and
an interval between a first group of the plurality of second through-holes provided around the second amplifier is smaller than an interval between a second group of the plurality of second through-holes provided around the first amplifier.

* * * * *